United States Patent

Hattori

[11] Patent Number: 6,120,968
[45] Date of Patent: Sep. 19, 2000

[54] PHOTOSENSITIVE RECORDING MEDIUM

[75] Inventor: Yasuhiro Hattori, Nagoya, Japan

[73] Assignee: Brother Kogyo Kabushiki Kaisha, Nagoya, Japan

[21] Appl. No.: 08/841,656

[22] Filed: Apr. 30, 1997

[30] Foreign Application Priority Data

May 8, 1996 [JP] Japan .................................. 8-113830

[51] Int. Cl.$^7$ .................................................. G03F 7/004
[52] U.S. Cl. ........................... 430/138; 430/30; 430/945; 427/213.31; 427/213.32; 427/150
[58] Field of Search ................... 430/138, 945, 430/200, 201, 30; 427/150, 213.31, 213.32, 213.34

[56] References Cited

U.S. PATENT DOCUMENTS

| | | | |
|---|---|---|---|
| 3,964,389 | 6/1976 | Peterson | 430/200 |
| 4,123,578 | 10/1978 | Perrington et al. | 430/200 |
| 4,303,548 | 12/1981 | Shimizaki et al. | 252/316 |
| 4,337,169 | 6/1982 | Shimizaki | 252/316 |
| 4,412,231 | 10/1983 | Namba et al. | 430/945 |
| 4,948,695 | 8/1990 | Matsushita et al. | 430/138 |
| 5,100,756 | 3/1992 | Kobayashi | 430/138 |
| 5,334,575 | 8/1994 | Noonan et al. | 430/201 |
| 5,466,556 | 11/1995 | Inaishi | 430/138 |
| 5,516,621 | 5/1996 | Tsuda et al. | 430/138 |
| 5,573,885 | 11/1996 | Inui et al. | 430/138 |
| 5,578,549 | 11/1996 | Burberry et al. | 430/201 |
| 5,686,220 | 11/1997 | Tsuda | 430/138 |

FOREIGN PATENT DOCUMENTS

| | | | |
|---|---|---|---|
| 63-65436 | 3/1988 | Japan | 430/138 |
| 3-39747 | 2/1991 | Japan . | |
| 3-77952 | 4/1991 | Japan . | |
| 5-39303 | 2/1993 | Japan . | |
| 6-27626 | 2/1994 | Japan . | |
| 6-51501 | 2/1994 | Japan . | |
| 6-51502 | 2/1994 | Japan . | |
| 6-75368 | 3/1994 | Japan | 430/138 |
| 6-123964 | 5/1994 | Japan | 430/138 |
| 6-130659 | 5/1994 | Japan | 430/138 |

*Primary Examiner*—Martin Angebranndt
*Attorney, Agent, or Firm*—Oliff & Berridge, PLC

[57] ABSTRACT

A photosensitive recording medium used to transfer and form an image onto an image-receiving medium, comprises a base material and formed thereon a photosensitive layer having a photosensitive material and an image-forming material, where the photosensitive layer is set to have a luminous reflectance of from 2% to 20%.

19 Claims, 2 Drawing Sheets

PHOTOSENSITIVE RECORDING MEDIUM

BACKGROUND OF THE INVENTION

1. Field of the Invention

This invention relates to a photosensitive recording medium used in image-forming apparatus.

2. Description of the Related Art

Japanese Patent Application Laid-open No. 5-39303 discloses a conventional photosensitive recording medium coated with photosensitive microcapsules so that color images can be transferred and formed on plain paper.

This photosensitive recording medium comprises a base material such as paper or resin film and a photosensitive layer coated on the base material, and the photosensitive layer is further coated with photosensitive microcapsules having as materials encapsulated therein a photosensitive material capable of hardening upon reaction with light and an image-forming material comprising a pigment or the like.

Thus, upon exposure of this photosensitive recording medium to light in accordance with image information, there occur some areas in which the photosensitive microcapsules have hardened and other areas in which they have not hardened. Thereafter, this medium and plain paper are brought into face-to-face contact, which are then, e.g., passed through a pair of pressure rollers so that an external force is applied to the microcapsules, whereupon the microcapsules having not hardened are collapsed but the microcapsules having hardened are not collapsed. From the microcapsules thus collapsed, the encapsulated materials comprising the image-forming material are released. Then, upon transfer of the encapsulated materials to the plain paper, images are formed on the plain paper.

However, the photosensitive recording medium disclosed in this publication employs photosensitive microcapsules which are sensitive to light with a wavelength of the ultraviolet region, and hence, for writing, the medium must be exposed to ultraviolet light before images are recorded, resulting in a very low practical utility. In particular, it has been impossible to reproduce any existing color images on plain paper by using the medium.

Accordingly, the present applicants have made studies to bring out a visible-light photosensitive material capable of directly hardening upon exposure to visible light rays. As the outcome of such studies, Japanese Patent Application Laid-open No. 3-39747 discloses a photo-hardening, photosensitive composition of such a material, and Japanese Patent Application Laid-open No. 3-77952 discloses a transfer recording medium employing such a photosensitive composition in the form of microcapsules.

Japanese Patent Applications Laid-open No. 6-27626, No. 6-51501 and No. 6-51502 also disclose image-forming microcapsules in which the above visible-light photosensitive material and an image-forming material such as a pigment are encapsulated.

In a disperse system in which such image-forming microcapsules are dispersed, a binder resin is added to prepare a coating composition, and this coating composition is coated on a base material such as plastic film so as to be in a stated thickness, followed by drying to form a coat layer. Thus, a photosensitive recording medium is obtained.

However, even with use of such a photosensitive recording medium, there have been problems such that images formed are unclear in some cases.

Stated specifically, images may have a low density, may have a whitish tone or have a blackish tone on the contrary, or may have an unnatural color tone in the case of color images.

Such problems are considered due to the fact that photosensitive recording mediums have differences in the quantity of colorants contained in the photosensitive layer of the photosensitive recording medium described above. The photosensitive recording medium is produced in the manner as described above, where the thickness of the photosensitive layer is fairly precisely controlled but it is difficult in manufacture to strictly control the quantity of the microcapsules contained in the photosensitive layer and the quantity of colorants contained in the microcapsules. As the result, individual photosensitive recording mediums have delicate differences in these.

In the case when the colorants are contained in the photosensitive layer in a relatively large quantity, the colorants that can be transferred to an image-receiving sheet are in a large quantity, resulting in a high image density as a matter of course. In such a case, however, the greater part of the amount of light used in exposure is absorbed by the colorants present in a large quantity, so that the light reaching the photosensitive material may become short. Hence, the microcapsules that should become hardened do not harden, and colorants having colors that should not be transferred are transferred, resulting in a poor color tone of the images formed.

On the other hand, in the case when the colorants are contained in the photosensitive layer in a small quantity, the light absorbed by the colorants is in a small amount, and hence the photosensitive material can better harden. Since, however, the colorants are in a small quantity, the image density may of course become low on the whole.

Thus, when an image-forming apparatus is designed to have a constant amount of light for exposure, the images formed may become different depending on the photosensitive recording mediums used.

SUMMARY OF THE INVENTION

The present invention was made in order to solve the above problems. Accordingly, an object of the present invention is to provide a photosensitive recording medium that can transfer images having proper image densities for the primary colors yellow, magenta and cyan and also having good color tones of mixed colors obtained by combination of the primary colors.

To achieve the above object, the present invention provides a photosensitive recording medium used to transfer and form an image onto an image-receiving medium, comprising a base material and formed thereon a photosensitive layer having a photosensitive material and an image-forming material, the photosensitive layer being set to have a luminous reflectance of from 2% to 20%.

This and other objects, features and advantages of the present invention are described in or will become apparent from the following detailed description of the invention.

DETAILED DESCRIPTION OF THE INVENTION

Figure 1:
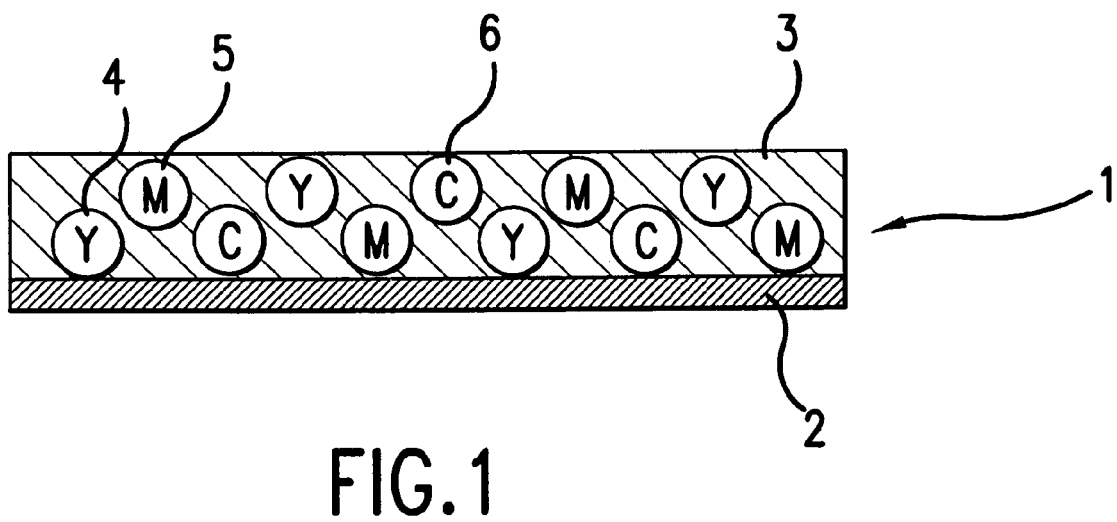
FIG. 1 is a schematic cross section of the photosensitive recording medium according to the present invention.

The photosensitive recording medium of the present invention will be described below in detail.

The photosensitive recording medium of the present invention is a recording medium used to transfer and form an image onto an image-receiving medium, and has a structure wherein a photosensitive layer having a photosensitive material and an image-forming material is formed on a base material. In particular, the recording medium is characterized in that the photosensitive layer is set to have a luminous reflectance of from 2% to 20%. This is because an insufficient image density tends to result if the luminous reflectance is less than 2%, and a poor image color tone also does if it is more than 20%. Hence, the photosensitive layer is set to have a luminous reflectance of from 2% to 20%, whereby images having a good density and color tone can be formed on the image-receiving medium.

In the present invention, the luminous reflectance of the photosensitive layer can be set to be from 2% to 20% by a method in which, e.g., at least one of the content of the image-forming material in the photosensitive layer and the layer thickness of the photosensitive layer is set in such a content or thickness that the luminous reflectance of the photosensitive layer comes to be from 2% to 20%.

As a preferred embodiment of the photosensitive recording medium according to the present invention, it may include an embodiment wherein the photosensitive material comprises a first photosensitive material having a maximum photosensitivity to blue light, a second photosensitive material having a maximum photosensitivity to green light and a third photosensitive material having a maximum photosensitivity to red light, and the image-forming material comprises a yellow colorant, a magenta colorant and a cyan colorant, where the first photosensitive material and the yellow colorant are micro-encapsulated to constitute yellow microcapsules, the second photosensitive material and the magenta colorant are micro-encapsulated to constitute magenta microcapsules and the third photosensitive material and the cyan colorant are micro-encapsulated to constitute cyan microcapsules. According to this embodiment, color images having proper image densities can be formed on the image-receiving medium. Especially when spectral reflectance to each of blue light, green light and red light in the photosensitive layer is set to be from 2% to 20%, full color images having good color tones of mixed colors can be formed on the image-receiving medium.

In the present invention, the spectral reflectance to each of blue light, green light and red light in the photosensitive layer can be set to be from 2% to 20% by a method in which, e.g., the proportion of yellow microcapsules, magenta microcapsules and cyan microcapsules mixed in the photosensitive layer is set in such a mixing proportion that the spectral reflectance to each of blue light, green light and red light in the photosensitive layer may come to be from 2% to 20%.

Herein, the luminous reflectance refers to what is prescribed in JIS Z8105, where the ratio of luminous flux V1 of the radiation incident on an object to luminous flux V2 of the radiation reflected from the object, V1/V2, is usually represented by percentage. This luminous reflectance may be measured by a method using a photometer or a reflectometer, or especially by a method using a densitometer which is used to evaluate image density of photographs and prints. In this instance, the value to be measured is optical density OD. Since this optical density is a value determined by OD=−log(V2/V1) regarding the base of a logarithm as 10, it is also possible to inversely determine the luminous reflectance from the optical density OD.

As for the spectral reflectance, it is what is also prescribed in JIS Z8105, where the reflectance of light of a specific wavelength region is usually expressed by percentage. In the case of the present embodiment, the light of a specific wavelength region refers to blue light of about 450 nm, green light of about 550 nm and red light of about 650 nm in wavelength. This spectral reflectance can be also measured using a spectrophotometer or a spectral reflectometer, or may be measured using the densitometer for measuring the optical density as a logarithm of the spectral reflectance.

Stated specifically, the above luminous reflectance and spectral reflectance are calculated in the following way: First, four different optical densities, black density, yellow density, magenta density and cyan density, are measured using a reflection densitometer RD-917, manufactured by Macbeth Co. Next, the luminous reflectance is determined from the black density; the spectral reflectance of blue light, from the yellow density; the spectral reflectance of green light, from the magenta density; and the spectral reflectance of red light, from the cyan density.

The photosensitive recording medium of the present invention will be described in greater detail with reference to the accompanying drawings.

As shown in FIG. 1, a photosensitive recording medium 1 according to the present embodiment is constituted of a base material 2 formed of a plastic film or the like, and a photosensitive layer 3 coated on the surface of the base material 2.

Stated more specifically, the photosensitive layer 3 has a structure wherein three different types of microcapsules, yellow color-forming photosensitive microcapsules (hereinafter "Y-capsules") 4, magenta color-forming photosensitive microcapsules (hereinafter "M-capsules") 5 and cyan color-forming photosensitive microcapsules (hereinafter "C-capsules") 6, are dispersed in a binder resin. The Y-capsules 4, the M-capsules 5 and the C-capsules 6 constitute the yellow microcapsules, magenta microcapsules and cyan microcapsules, respectively, of the present invention.

The Y-capsules hold therein the first photosensitive material having a maximum photosensitivity (or maximum hardening sensitivity to blue light (e.g., light having a wavelength of about 450 nm) and the yellow color image-forming material. The M-capsules hold therein the second photosensitive material having a maximum photosensitivity to green light (e.g., light having a wavelength of about 550 nm) and the magenta color image-forming material. The C-capsules hold therein the third photosensitive material having a maximum photosensitivity to red light (e.g., light having a wavelength of about 650 nm) and the cyan color image-forming material.

Figure 2:
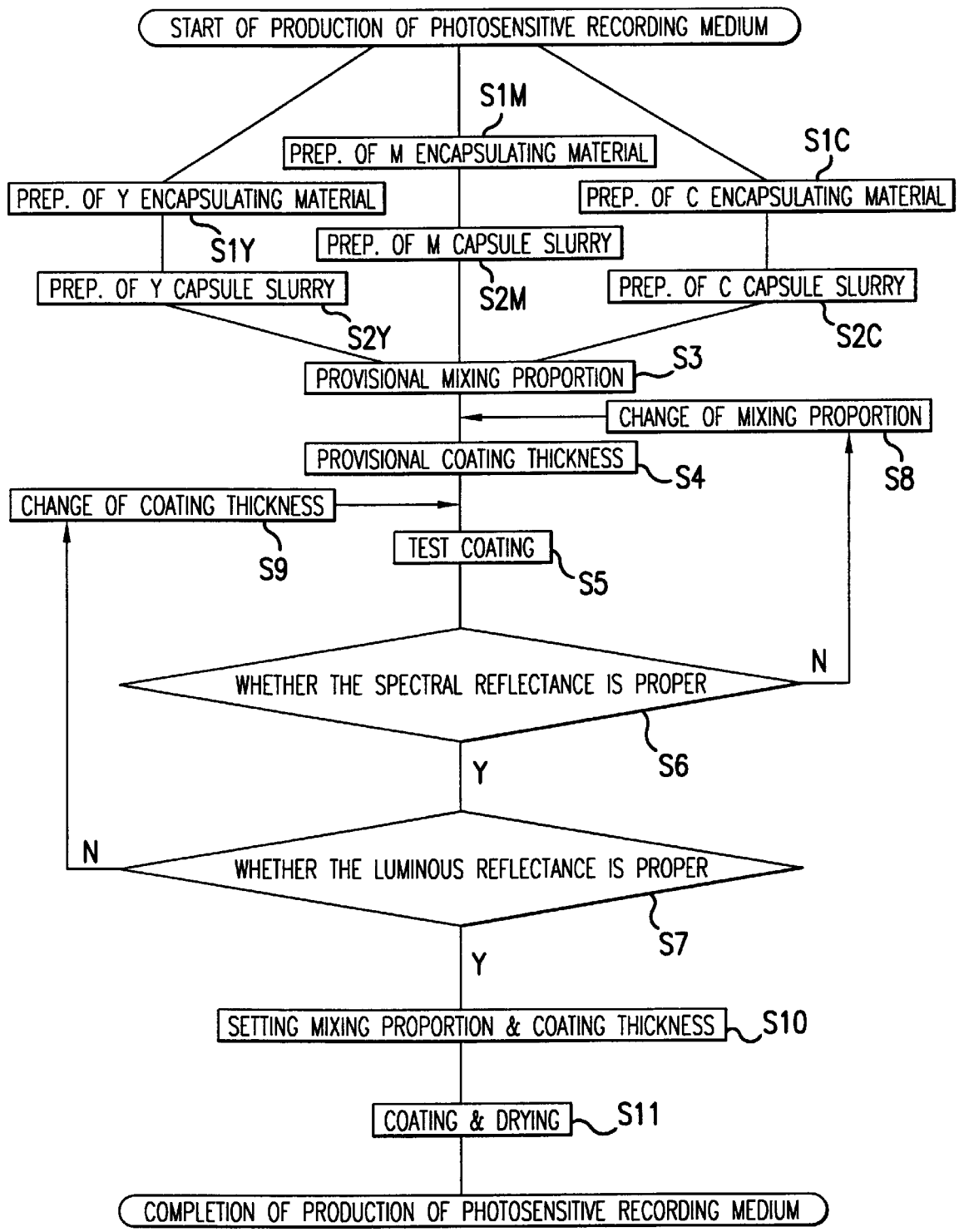
FIG. 2 is a flow chart showing a process for producing the photosensitive recording medium of the present invention.

This photosensitive recording medium can be produced by a method as described below with reference to FIG. 2.

First, the materials to be encapsulated in the microcapsules (i.e., encapsulating materials) are prepared (S1Y, S1M, S1C; S represents a step; the same applies hereinafter). The materials to be encapsulated are comprised of the photosensitive materials and the image-forming materials. The photosensitive materials are each comprised of at least a polymerizable material and a photopolymerization initiator.

The polymerizable material may include unsaturated compounds, e.g., compounds having ethylenically unsaturated groups and compounds having epoxy groups. The compounds having ethylenically unsaturated groups are particularly preferred, as having a relatively higher photopolymerization rate. The compounds having ethylenically unsaturated groups may include acrylic acid and salts thereof, acrylates, acrylamides, methacrylic acid and salts thereof, methacrylates, methacrylamides, maleic anhydrides, maleates, itaconates, styrenes, vinyl ethers, vinyl esters, N-vinyl heterocyclic rings, allyl ethers, allyl esters, and derivatives of these. Acrylates or methacrylates are more preferred.

As examples of the acrylates, they may include butyl acrylate, cyclohexyl acrylate, ethylhexyl acrylate, benzyl acrylate, furfuryl acrylate, ethoxyethyl acrylate, tricyclodecanyloxy acrylate, nonylphenyloxyethyl acrylate, hexanediol acrylate, 1,3-dioxolane acrylate, hexanediol diacrylate, butanediol diacrylate, neopentyl glycol diacrylate, polyethylene glycol diacrylate, tricyclodecanedimethylol diacrylate, tripropylene glycol diacrylate, bisphenol-A diacrylate, pentaerythritol triacrylate, dipentaerythritol hexaacrylate, dipentaerythritol caprolactone adduct hexaacrylate, trimethylolpropane triacrylate, trimethylolpropane propylene oxide adduct triacrylate, polyoxyethylated bisphenol-A diacrylate, polyester acrylate, and polyurethane acrylate.

As examples of the methacrylates, they may include butyl methacrylate, cyclohexyl methacrylate, ethylhexyl methacrylate, benzyl methacrylate, furfuryl methacrylate, ethoxyethyl methacrylate, tricyclodecanyloxy methacrylate, nonylphenyloxyethyl methacrylate, hexanediol methacrylate, 1,3-dioxolane methacrylate, hexanediol dimethacrylate, butanediol dimethacrylate, neopentyl glycol dimethacrylate, polyethylene glycol dimethacrylate, tricyclodecanedimethylol dimethacrylate, tripropylene glycol dimethacrylate, bisphenol-A dimethacrylate, pentaerythritol trimethacrylate, dipentaerythritol hexamethacrylate, dipentaerythritol caprolactone adduct hexamethacrylate, trimethylolpropane trimethacrylate, trimethylolpropane propylene oxide adduct trimethacrylate, polyoxyethylated bisphenol-A dimethacrylate, polyester methacrylate, and polyurethane methacrylate. These polymerizable materials may each be used alone or in the form of a mixture of two or more.

It is particularly preferred that at least one of pentaerythritol triacrylate, dipentaerythritol hexaacrylate, dipentaerythritol caprolactone adduct hexaacrylate, trimethylolpropane triacrylate, and trimethylolpropane propylene oxide adduct triacrylate is contained, which have at least three unsaturated groups acrylonitrile groups in the molecule.

The photopolymerization initiator is a compound that receives light energy to initiate or accelerate the polymerization reaction of the polymerizable materials, and may be used under appropriate selection from among aromatic carbonyl compounds, acetophenones, organic peroxides, diphenylhalonium salts, organic halides, 2,4,6-substituted-S-triazines, 2,4,5-triarylimidazole dimers, azo compounds, dye borate complexes, metal arene complexes and titanocene compounds, in accordance with wavelengths at which the photosensitive materials are sphotosensitive.

It may preferably include benzophenone, benzyl, xanthone, thioxanthone, anthraquinone, acetophenone, 2,2-dimethyl-2-morpholino-4'-methylthioacetophenone, benzoyl peroxide, 3,3',4,4'-tetrakis(t-butyldioxycarbonyl) benzophenone, diphenyliodonium bromide, diphenyliodonium chloride, carbon tetrachloride, carbon tetrabromide, 2,4,6-tristrichloromethyl-S-triazine, and ($\eta^5$-2,4-cyclopentadien-1-yl)[(1,2,3,4,5,6-$\eta$)-(1-methylethyl) benzene]iron(1+) hexafluorophosphate(1−). These photopolymerization initiators may each be used alone or in the form of a mixture of two or more.

The photopolymerization initiator may be used in an amount of from 0.1 to 10% by weight, and preferably from 1 to 10% by weight, based on the weight of the polymerizable material. If it is in an amount less than 0.1% by weight, the photopolymerization reaction may take place with difficulty. Even if it is used in an amount more than 20% by weight, the sensitivity is no longer improved.

A sensitizing dye may also be used in combination so that the sensitivity, in particular, photosensitive characteristics to wavelength, of the photosensitive materials can be improved. The sensitizing dye may include xanthene dyes, coumarin dyes, merocyanine dyes, thiazine dyes, azine dyes, methine dyes, oxazine dyes, phenylmethane dyes, cyanine dyes, azo dyes, anthraquinone dyes, pyrazoline dyes, stilbene dyes and quinoline dyes, any of which may be used.

Materials used to form walls (or shells) of the microcapsules may include inorganic materials and organic materials, either of which may be used so long as the walls can be formed by the present capsule preparation method. Materials that can well transmit light are preferred.

As examples, such materials may include gelatin, gum arabic, starch, sodium alginate, polyvinyl alcohol, polyethylene, polyamide, polyester, polyurethane, polyurea, polystyrene, nitrocellulose, ethyl cellulose, methyl cellulose, melamine-formaldehyde resin, urea-formaldehyde resin, and copolymers of any of these.

Melamine-formaldehyde resin and urea-formaldehyde resin are particularly preferred, which can be produced by a relatively simple process because they are produced by an in-situ method in which materials for the walls are fed only in water.

When the microcapsules are prepared in this way, a composition used as a material to be encapsulated must be dispersed or emulsified in an aqueous medium. In such an instance, the aqueous medium may preferably contain a nonionic or anionic water-soluble polymer.

As the nonionic water-soluble polymer, it may include polyvinyl alcohol, polyvinyl pyrrolidone, polyacrylamide, polymethyl vinyl ether, hydroxymethyl cellulose, and hydroxyethyl cellulose. As the anionic water-soluble polymer, it may include polystyrene sulfinic acid, polystyrene sulfonate, a styrene-sulfonic acid copolymer, polyvinyl sulfate, polyvinyl sulfonate, a maleic anhydride-styrene copolymer, and a maleic anhydride-isobutylene copolymer.

The microcapsules may preferably have a particle size (diameter) as small as possible because the resolution of images is improved, but such capsules can be prepared with difficulty, resulting in a high cost. On the other hand, the larger the particle size is, the lower the resolution of images is. Accordingly, they may have a particle size of from 0.001 to 0.03 mm, and preferably from 0.005 to 0.02 mm. Also, needless to say, the less scattering the particle size has, the more preferable images can be obtained.

A liquid material prepared by dispersing the photosensitive microcapsules are dispersed in water in this way is called a capsule slurry. Three different capsule slurries are prepared, corresponding to the yellow, magenta and cyan microcapsules (S2Y, S2M, S2C).

Next, samples for measuring reflectance are prepared. More specifically, the mixing proportion of the above three different capsule slurries are provisionally determined (S3), and a binder resin is added to the mixture obtained, followed by thorough stirring. Then, the intended coating thickness of the photosensitive layer 3 is provisionally determined (S4). A coater bar that may accord with this coating thickness is selected, and the mixture is test-coated on a polyethylene terephthalate (PET) film (S5). Next, after the coating formed has been well dried, the spectral reflectance and luminous reflectance are measured.

As the result of the measurement, an instance where the spectral reflectance is not within the range of from 2% to 20%, i.e., an instance where the spectral reflectance is improper (S6, N) means that the provisional mixing proportion is improper, and hence the mixing proportion of the three different capsule slurries is changed (S8). For example, an instance where the spectral reflectance of blue light is 1% means that the yellow colorant is too much, and hence the yellow capsule slurry is relatively decreased. An instance where the spectral reflectance of green light is 30% means that the magenta colorant is too little, and hence the magenta capsule slurry is relatively increased.

As other examples, an instance where the luminous reflectance is less than 2%, i.e., an instance where the luminous reflectance is improper (S7, N) means that the coating thickness of the photosensitive layer 3 is too large to be proper, and hence the coating thickness is made smaller (S9). On the other hand, an instance where the luminous reflectance is greater than 20% (S7, N) means that the provisional coating thickness is too small to be proper, and hence the coating thickness is made larger (S9).

Then, an instance where all the luminous reflectance and the spectral reflectance are within the range of from 2% to 20% and proper (S6, Y; S7, Y) means that the provisional mixing proportion and coating thickness are proper, and hence the mixing proportion and coating thickness are set there (S10) to proceed to the next coating and drying steps (S11).

The photosensitive recording medium 1 according to the present embodiment is thus produced.

Materials used in the base material 2 of the photosensitive recording medium 1 may include papers such as plain paper, woodfree paper and coated paper; films of resins such as polyester, polyethylene, polypropylene, acetyl cellulose, cellulose ester, polyvinyl acetal, polystyrene, polycarbonate, polyethylene terephthalate, and polyimide; and synthetic papers comprised of papers and resins. In particular, films of polyethylene terephthalate or the like are preferred because they have superior plane smoothness, strength and so forth, and also have a thickness of as small as 0.05 mm and can have a relatively small volume when brought into a roll. Any of these films on at least one side of which a reflective layer is formed by aluminum vacuum deposition are particularly preferred because of an effect of improving the photosensitivity of the photosensitive recording medium. The base material may be used either in the form of a rolled sheet or in the form of a cut sheet.

To form the photosensitive layer by coating a microcapsule composition on the base material 2, a microcapsule dispersion may be used in which a hydrophilic binder resin is mixed. The hydrophilic binder resin may include natural materials such as gelatin, cellulose, starch and gum arabic, and synthetic polymeric materials such as polyvinyl alcohol, polyvinyl pyrrolidone, polyacrylic acid, polymethacrylic acid, polyacrylamide, polyvinyl imidazole and polystyrene sulfonic acid, any of which may be used.

EXAMPLES

The present invention will be described below in greater detail by specifically giving Examples.

Example 1

First, a cyan capsule slurry (Ca) was prepared in the following way.

Polymerizable materials pentaerythritol triacrylate and dipentaerythritol hexaacrylate were weighed out in a weight ratio of 1:4 and were mixed by means of a stirrer to obtain an acrylic material. To this acrylic material, a phthalocyanine cyan pigment was added, followed by mixing, and thereafter the mixture was kneaded 10 passes by means of a three-roll mill to prepare a mill base with the pigment dispersed in the polymerizable materials.

To the mill base thus prepared, the above acrylic material was added, followed by uniform mixing by means of a dispersion machine to prepare a cyan pigment dispersion.

To the cyan pigment dispersion, a wavelength sensitizing dye squarilium dye and a photopolymerization initiator ($\eta^5$-2,4-cyclopentadien-1-yl)[(1,2,3,4,5,6-$\eta$))-(1-methylethyl)benzene]iron(1+) hexafluorophosphate(1−) were added, which were then mixed and dissolved while heating at about 50° C. to obtain a composition serving as the material to be encapsulated in microcapsules.

Formulation of the composition is as shown below in part(s) by weight.

| | |
|---|---|
| Acrylic materials (polymerizable compounds) | 100 parts |
| Pigment | 2 parts |
| Photopolymerization initiator | 3 parts |
| Wavelength sensitizing dye | 0.5 part |

Hardening wave length characteristics of this composition were measured to find that it had a maximum hardening sensitivity (maximum photosensitivity) in a visible light region of about 650 nm, i.e., the red light region.

Next, an emulsifier 1:1 aqueous solution mixture of an aqueous solution of 5% of partial sodium salt of polystyrene sulfonic acid and an aqueous solution of 5% of styrene-maleic anhydride copolymer was prepared. In 200 ml of this mixture, 100 g of the above composition was added, followed by stirring at 6,000 r.p.m. for 5 minutes by means of a homogenizer. Thus, what is called an oil-in-water (O/W) emulsion in which the above composition was present in water in a disperse state was obtained.

Separately from the above, commercially available melamine powder was added to an aqueous 37% formaldehyde solution, and the pH of the mixture obtained was adjusted to 9.0 using a sodium hydroxide solution, followed by heating at a water temperature of 60° C. for 30 minutes to obtain a melamine-formaldehyde prepolymer.

The melamine-formaldehyde prepolymer was added to the O/W emulsion previously prepared, and the mixture obtained was heated so as to have a water temperature of 50° C. while stirring at 100 to 300 r.p.m. by means of an agitating homomixer. This state of heating was maintained for 5 hours, and thereafter the pH of the mixture was adjusted to 7, followed by cooling to room temperature. Thus, a cyan capsule slurry (Ca) in which cyan capsules having the above composition encapsulated therein and whose shells (walls) were formed of melamine-formaldehyde resin were obtained by the in-situ method.

Next, a magenta capsule slurry (Ma) was prepared in the following way.

The above procedure was repeated to prepare a composition serving as the material to be encapsulated in magenta microcapsules, except that the phthalocyanine cyan pigment was replaced with a quinacridone magenta pigment and as the wavelength sensitizing dye the squarilium dye was replaced with a cyanine dye.

Hardening wave length characteristics of this composition were measured to find that it had a maximum hardening sensitivity (maximum photosensitivity) in a visible light region of about 550 nm, i.e., the green light region.

The subsequent procedure for preparing the cyan capsule slurry (Ca) was similarly taken to prepare a magenta capsule slurry (Ma).

Next, a yellow capsule slurry (Ya) was prepared in the following way.

The above procedure was repeated to prepare a composition serving as the material to be encapsulated in yellow microcapsules, except that the phthalocyanine cyan pigment was replaced with an azo barium lake type yellow pigment and as the wavelength sensitizing dye the squarilium dye was replaced with a coumarin dye.

Hardening wave length characteristics of this composition were measured to find that it had a maximum hardening sensitivity (maximum photosensitivity) in a visible light region of about 450 nm, i.e., the blue light region.

The subsequent procedure for preparing the cyan capsule slurry (Ca) was similarly taken to prepare a yellow capsule slurry (Ya).

The cyan capsule slurry (Ca), magenta capsule slurry (Ma) and yellow capsule slurry (Ya) thus prepared were mixed in a proportion of 1:1:1 in weight ratio. To 1 liter of the mixture solution obtained, 0.3 liter of an aqueous 2% polyvinyl alcohol solution as a binder was added to prepare a capsule coating solution.

The coating solution thus obtained was test-coated on a polyester film of 0.038 mm thick by means of a bar coater. Provisional coating thickness was 0.020 mm.

Next, using a reflection densitometer RD-917, manufactured by Macbeth Co., four different optical reflection densities of black density, yellow (Y) density, magenta (M) density and cyan (C) density were measured.

From the values thus obtained, the luminous reflectance, blue (B) spectral reflectance, green (G) spectral reflectance and red (R) spectral reflectance were calculated. As the result, as shown in Table 1 they were all within the range of from 2% to 20%.

Accordingly, the photosensitive recording medium was produced in the above provisional mixing proportion and provisional coating thickness which were employed as they were.

Next, using as an original a color chart of The Society of Electrophotography, the photosensitive recording medium thus produced was exposed, and the photosensitive recording medium thus exposed and a plain paper image-receiving medium were put into face-to-face contact, followed by pressing to form an image on the image-receiving medium.

As exposure conditions used here, the intensity of a light source was so controlled that the white areas of the image had an illuminance of 600 lux. As a result, the exposure time necessary for forming the image was 40 seconds, and hence the photosensitivity of this photosensitive recording medium was evaluated as "good".

Density evaluation on whether or not the image formed had a sufficient density and color tone evaluation on whether or not its color tone was good when compared with that of the original were also made to obtain the result that the both are "good".

The results of the evaluation are shown in Table 1.

Example 2

A photosensitive recording medium was produced in the same manner as in Example 1 except that the coating thickness which was 0.020 mm in Example 1 was changed to 0.016 mm. Evaluation was also made similarly. In this instance too, the luminous reflectance, blue (B) spectral reflectance, green (G) spectral reflectance and red (R) spectral reflectance, though being greater values than those in Example 1, were all within the range of from 2% to 20%. As to the density of the image formed, it was a little lower than that in Example 1 but was good. The photosensitivity was better than that in Example 1 and the color tone was also good.

The results obtained are shown together in Table 1.

Comparative Example 1

A photosensitive recording medium was produced in the same manner as in Example 1 except that the amount of the pigment which was 2 parts by weight in Example 1 was changed to 3 parts by weight. Evaluation was also made similarly. The luminous reflectance, blue (B) spectral reflectance, green (G) spectral reflectance and red (R) spectral reflectance showed values all smaller than those in Example 1, and the image formed had a very high density. However, it took a very long exposure time of 80 seconds for forming the image.

The results obtained are shown together in Table 1.

Comparative Example 2

A photosensitive recording medium was produced in the same manner as in Example 1 except that the coating thickness which was 0.020 mm in Example 1 was changed to 0.015 mm. Evaluation was also made similarly. The luminous reflectance and red (R) spectral reflectance showed values greater than 20%. The image formed had a low density, which was evaluated as "poor".

The results obtained are shown together in Table 1.

Comparative Example 3

A photosensitive recording medium was produced in the same manner as in Example 1 except that the mixing proportion of the three capsule slurries which was 1:1:1 in Example 1 was changed to 1:2:2. Evaluation was also made similarly. The blue (B) spectral reflectance showed a value greater than 20%, and the image formed had a bluish tone, which was evaluated as "poor".

The results obtained are shown together in Table 1.

As describe above, as is also seen from Table 1, the photosensitive recording medium has a superior photosensitivity when its photosensitive layer has a luminous reflectance of from 2% to 20%, so that the exposure time necessary for forming images can be shorter and also the images formed can have a good density.

Color images formed can also have a good color tone when the photosensitive recording medium fulfills the conditions that the luminous reflectance, blue spectral reflectance, green spectral reflectance and red spectral reflectance are all within the range of from 2% to 20%.

The entire disclosure of the Japanese Patent application NO. 8-113830 filed on May 8, 1996 including specification, claims, drawings and summary is incorporated herein by reference in its entirety.

TABLE 1

|  | Example | | Comparative Example | | |
| --- | --- | --- | --- | --- | --- |
|  | 1 | 2 | 1 | 2 | 3 |
| Evaluation on photosensitive recording medium | | | | | |
| Luminous reflection density: | 1.15 | 0.85 | 1.72 | 0.67 | 1.12 |
| Luminous reflectance: | 7.08% | 14.13% | 1.91% | 21.38% | 7.59% |
| Yellow (Y) reflection density: | 1.36 | 0.92 | 1.78 | 0.92 | 0.65 |
| Blue (B) spectral reflectance: | 4.37% | 12.02% | 1.66% | 12.02% | 22.39% |
| Magenta (M) reflection density: | 1.23 | 0.75 | 1.65 | 0.85 | 1.42 |
| Green (G) spectral reflectance: | 5.89% | 17.78% | 2.24% | 14.13% | 3.80% |
| Cyan (C) reflection density: | 1.12 | 0.81 | 1.52 | 0.55 | 1.35 |
| Red (R) spectral reflectance: | 7.59% | 15.49% | 3.02% | 28.18% | 4.47% |
| Photosensitivity evaluation: | Good | Good | Poor | Good | Good |
| Evaluation of images | | | | | |
| Density evaluation: | Good | Good | Good | Poor | Good |
| Color tone evaluation: | Good | Good | Good | Good | Poor |

What is claimed is:

1. A process for preparing a photosensitive recording medium used to transfer and form an image onto an image-receiving medium, comprising:

forming onto a base material a photosensitive layer having a coating thickness and having a structure in which microcapsules comprising a photosensitive material and an image-forming material are dispersed in a hydrophilic binder to produce a formed photosensitive recording medium, wherein the microcapsules comprise a photopolymerizable material a photopolymerization initiator and a sensitizing dye; and determining, before the microcapsules are developed, whether the luminous reflectance of the formed photosensitive recording medium is from 2% to 20% across the visible spectrum, wherein, when said luminous reflectance is less than 2% across the visible spectrum, the coating thickness in the forming step is reduced and, when the luminous reflectance is greater than 20% across the visible spectrum, the coating thickness in the forming step is increased.

2. The process according to claim 1, wherein said photosensitive material comprises a first photosensitive material having a maximum photosensitivity to blue light, a second photosensitive material having a maximum photosensitivity to green light and a third photosensitive material having a maximum photosensitivity to red light, and said image-forming material comprises a yellow colorant, a magenta colorant and a cyan colorant;

said first photosensitive material and said yellow colorant being micro-encapsulated to constitute yellow microcapsules, said second photosensitive material and said magenta colorant being micro-encapsulated to constitute magenta microcapsules, and said third photosensitive material and said cyan colorant being micro-encapsulated to constitute cyan microcapsules.

3. The process according to claim 2, wherein said microcapsules each have a wall constituted of at least one of gelatin, gum arabic, starch, sodium alginate, polyvinyl alcohol, polyethylene, polyamide, polyester, polyurethane, polyurea, polystyrene, nitrocellulose, ethyl cellulose, methyl cellulose, melamine-formaldehyde resin, urea-formaldehyde resin, and a copolymer of any of these.

4. The process according to claim 3, wherein said wall is constituted of melamine-formaldehyde resin or urea-formaldehyde resin.

5. The process according to claim 2, wherein said microcapsules have a particle diameter of from 0.001 to 0.03 mm.

6. The process according to claim 2, wherein the proportion of yellow microcapsules, magenta microcapsules and cyan microcapsules mixed in the photosensitive layer is set in such a mixing proportion that the spectral reflectance to each of blue light, green light and red light in the photosensitive layer comes to be from 2% to 20%.

7. The process according to claim 1, wherein said polymerizable material is a compound having an ethylenically unsaturated group or a compound having an epoxy group.

8. The process according to claim 7, wherein said compound having an ethylenically unsaturated group is at least one of acrylic acid or a salt thereof, an acrylate, an acrylamide, methacrylic acid or a salt therefore, a methacrylate, a methacrylamide, maleic anhydride, a maleate, an itaconate, a styrene, a vinyl ether, a vinyl ester, an N-vinyl heterocyclic ring, an allyl ether, and an allyl ester.

9. The process according to claim 7, wherein said compound having an ethylenically unsaturated group is an acrylate or a methacrylate.

10. The process according to claim 9, wherein said acrylate is at least one of butyl acrylate, cyclohexyl acrylate, ethylhexyl acrylate, benzyl acrylate, furfuryl acrylate, ethoxyethyl acrylate, tricyclodecanyloxy acrylate, nonylphenyloxyethyl acrylate, hexanediol acrylate, 1,3-dioxolane acrylate, hexanediol diacrylate, butanediol diacrylate, neopentyl glycol diacrylate, polyethylene glycol diacrylate, tricyclodecanedimethylol diacrylate, tripropylene glycol diacrylate, bisphenol-A diacrylate, pentaerythritol triacrylate, dipentaerythritol hexaacrylate, hexaacrylate of an addition product obtained by adding caprolactone to dipentaerythritol, trimethylolpropane triacrylate, triacrylate of an addition product obtained by adding propylene oxide to trimethylolpropane, polyoxyethylated bisphenol-A diacrylate, polyester acrylate and polyurethane acrylate.

11. The process according to claim 9, wherein said methacrylate is at least one of butyl methacrylate, cyclohexyl methacrylate, ethylhexyl methacrylate, benzyl methacrylate, furfuryl methacrylate, ethoxyethyl methacrylate, tricyclodecanyloxy methacrylate, nonylphenyloxyethyl methacrylate, hexanediol methacrylate, 1,3-dioxolane methacrylate, hexanediol dimethacrylate, butanediol dimethacrylate, neopentyl glycol dimethacrylate, polyethylene glycol dimethacrylate, tricyclodecanedimethylol dimethacrylate, tripropylene glycol dimethacrylate, bisphenol-A dimethacrylate, pentaerythritol trimethacrylate, dipentaerythritol hexamethacrylate, hexaacrylate of an addition product obtained by adding caprolactone to dipentaerythritol, trimethylolpropane trimethacrylate, triacrylate of an addition product obtained by adding propylene oxide to trimethylolpropane, polyoxyethylated bisphenol-A dimethacrylate, polyester methacrylate and polyurethane methacrylate.

12. The process according to claim 1, wherein said polymerizable material is at least one of pentaerythritol triacrylate, dipentaerythritol hexaacrylate, hexaacrylate of an addition product obtained by adding caprolactone to dipentaerythritol, trimethylolpropane triacrylate, and triacrylate of an addition product obtained by adding propylene oxide to trimethylolpropane.

13. The process according to claim 1, wherein said photopolymerization initiator is at least one of an aromatic carbonyl compound, an acetophenone, an organic peroxide, a diphenylhalonium salt, an organic halide, a 2,4,6-substituted-S-triazine, a 2,4,5-triallylimidazole dimer, an azo compound, a dye borate complex, a metal arene complex and a titanocene compound.

14. The process according to claim 1, wherein said photopolymerization initiator is at least one of benzophenone, benzyl, xanthone, thioxanthone, anthraquinone, acetophenone, 2,2-dimethyl-2-morpholino-4'-methylthioacetophenone, benzoyl peroxide, 3,3',4,4'-tetrakis(t-butyldioxycarbonyl)benzophenone, diphenyliodonium bromide, diphenyliodonium chloride, carbon tetrachloride, carbon tetrabromide, 2,4,6-tristrichloromethyl-S-triazine and ($\eta^5$-2,4-cyclopentadien-1-yl)[(1,2,3,4,5,6-$\eta$)-(1-methylethyl)benzene]iron(1+)hexafluorophosphate(1−).

15. The process according to claim 1, wherein said photopolymerization initiator is contained in an amount of from 0.1% by weight to 20% by weight based on the weight of the polymerizable material.

16. The process according to claim 1, wherein said photopolymerization initiator is contained in an amount of from 1% by weight to 10% by weight based on the weight of the polymerizable material.

17. The process according to claim 1, wherein said photosensitive material further contains a sensitizing dye.

18. The process according to claim 17, wherein said sensitizing dye is at least one of a xanthene dye, a coumarin dye, a merocyanine dye, a thiazine dye, an azine dye, a methine dye, an oxazine dye, a phenylmethane dye, a cyanine dye, an azo dye, an anthraquinone dye, a pyrazoline dye, a stilbene dye and a quinoline dye.

19. The process of claim 1, further comprising determining, before the microcapsules are developed, whether each of the blue spectral reflectance of the formed photosensitive recording medium, the green spectral reflectance of the formed photosensitive recording medium and the red spectral reflectance of the formed photosensitive recording medium is from 2% to 20%.

* * * * *